US008673704B2

(12) United States Patent
Zhu et al.

(10) Patent No.: US 8,673,704 B2
(45) Date of Patent: Mar. 18, 2014

(54) FINFET AND METHOD FOR MANUFACTURING THE SAME

(75) Inventors: Huilong Zhu, Poughkeepsie, NY (US); Wei He, Beijing (CN); Qingqing Liang, Lagrangeville, NY (US); Haizhou Yin, Poughkeepsie, NY (US); Zhijiong Luo, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/579,192

(22) PCT Filed: May 14, 2012

(86) PCT No.: PCT/CN2012/075437
§ 371 (c)(1),
(2), (4) Date: Aug. 15, 2012

(87) PCT Pub. No.: WO2013/166733
PCT Pub. Date: Nov. 14, 2013

(65) Prior Publication Data
US 2013/0299885 A1      Nov. 14, 2013

(30) Foreign Application Priority Data
May 9, 2012  (CN) .......................... 2012 1 0141545

(51) Int. Cl.
*H01L 21/00* (2006.01)
(52) U.S. Cl.
USPC ........... 438/164; 438/197; 438/198; 438/283; 257/E21.429; 257/349; 257/350; 257/347
(58) Field of Classification Search
USPC .................. 257/347, 349–350, 190, E21.429; 438/164, 197–198, 283
See application file for complete search history.

(56) References Cited

U.S. PATENT DOCUMENTS

| 6,413,802 | B1 | 7/2002 | Hu et al. | |
| 2008/0073667 | A1* | 3/2008 | Lochtefeld | 257/190 |
| 2009/0014795 | A1 | 1/2009 | Koh et al. | |
| 2012/0171832 | A1* | 7/2012 | Toh et al. | 438/300 |
| 2013/0105914 | A1* | 5/2013 | Lin | 257/402 |

FOREIGN PATENT DOCUMENTS

| CN | 101297406 A | 10/2008 |
| CN | 102214676 A | 10/2011 |

OTHER PUBLICATIONS

International Search Report and Written Opinion of the Chinese State Intellectual Property Office in application No. PCT/CN2012/075437 dated Feb. 28, 2013.

* cited by examiner

*Primary Examiner* — Matthew W Such
*Assistant Examiner* — Ali Naraghi
(74) *Attorney, Agent, or Firm* — Kinney & Lange, P.A.

(57) ABSTRACT

A FinFET and a method for manufacturing the same are disclosed. The FinFET comprises an etching stop layer on a semiconductor substrate; a semiconductor fin on the etching stop layer; a gate conductor extending in a direction perpendicular to a length direction of the semiconductor fin and covering at least two side surfaces of the semiconductor fin; a gate dielectric layer between the gate conductor and the semiconductor fin; a source region and a drain region which are provided at two ends of the semiconductor fin respectively; and an interlayer insulating layer adjoining the etching stop layer below the gate dielectric layer, and separating the gate conductor from the etching stop layer and the semiconductor fin. A height of the fin of the FinFET is approximately equal to a thickness of a semiconductor layer for forming the semiconductor fin.

10 Claims, 9 Drawing Sheets

FINFET AND METHOD FOR MANUFACTURING THE SAME

CROSS-REFERENCE TO RELATED APPLICATION

This application is a National Phase application of, and claims priority to, PCT Application No. PCT/CN2012/075437, filed on May 14, 2012, entitled "FINFET AND METHOD FOR MANUFACTURING THE SAME", which claimed priority to the Chinese Patent Application No. 201210141545.5, filed on May 9, 2012. Both the PCT Application and Chinese Application are incorporated herein by reference in their entireties.

TECHNICAL FIELD

The present disclosure relates to semiconductor integrated circuits, and in particular, to FinFETs and methods for manufacturing the same.

BACKGROUND

An important trend in development of semiconductor technology is scaling down of metal-oxide-semiconductor field effect transistors (MOSFETs) for improving integration level and reducing manufacturing cost. However, it is well known that short channel effects arise as the size of MOSFETs decreases. As the MOSFETs are scaled down, a gate also has a reduced effective length and actually controls fewer charges in a depletion region when a gate voltage is applied. Consequently, a threshold voltage of the MOSFETs drops with a reduced channel length.

Chenming Hu et al. discloses a FinFET formed on a SOI (silicon-on-insulator) substrate in U.S. Pat. No. 6,413,802, which comprises a channel region provided in a central portion of a fin of semiconductive material, and source/drain regions provided at two ends of the fin. A gate electrode is provided at both sides of the channel region and surrounds the latter to provide for example a double-gate FinFET, in which inversion channels are created at both sides of the fin. The channel region in the fin has a small thickness so that the whole channel region is controlled by the gate, which suppresses the short channel effect. Thus, the FinFET is an excellent candidate for the MOSFET which is further scaled down in size.

Both in a double-gate FinFET having a gate over two side surfaces of a fin and in a triple-gate FinFET having a gate over a top surface and two side surfaces of a fin, the gate extends mainly over the two side surfaces of the fin. Consequently, a channel width of the FinFET depends on a height of the fin of the FinFET. However, in conventional FinFETs, the fin is typically formed from a bulk silicon by etching. The height of the fin cannot be well controlled. Variations of the height of the fin in the manufacture process adversely affect properties of the FinFETs.

SUMMARY OF THE DISCLOSURE

The object of the present disclosure is to provide a FinFET having a well-controlled height of the semiconductor fin and a method for manufacturing the same.

According to one aspect of the present disclosure, there is provided a FinFET comprising an etching stop layer on a semiconductor substrate; a semiconductor fin on the etching stop layer; a gate conductor extending in a direction perpendicular to a length direction of the semiconductor fin and covering at least two side surfaces of the semiconductor fin; a gate dielectric layer between the gate conductor and the semiconductor fin; a source region and a drain region which are provided at two ends of the semiconductor fin respectively; and an interlayer insulating layer adjoining the etching stop layer below the gate dielectric layer, and separating the gate conductor from the etching stop layer and the semiconductor fin.

According to another aspect of the present disclosure, there is provided a method for manufacturing a FinFET, comprising: forming an etching stop layer on a semiconductor substrate; forming a semiconductor fin on the etching stop layer; forming a gate dielectric layer on the semiconductor fin and on the etching stop layer; removing a portion of the gate dielectric layer and a portion of the etching stop layer to expose the corresponding portion of the surface of the semiconductor substrate; forming an interlayer insulating layer on an exposed surface of the semiconductor substrate and below a portion of the gate dielectric layer so that the interlayer insulating layer adjoins the etching stop layer below the gate dielectric layer; forming a gate conductor on the gate dielectric layer and on the interlayer insulating layer, wherein the gate conductor covers at least portions of two side surfaces of the semiconductor fin; and forming a source region and a drain region by implanting ions at two ends of the semiconductor fin.

The inventive FinFET comprises the etching stop layer. Because etching stops at the top of the etching stop layer when the semiconductor fin is formed from the semiconductor layer, a height of the semiconductor fin is approximately equal to a thickness of the semiconductor layer. The thickness of the semiconductor layer can be well controlled. Consequently, the height of the semiconductor fin, and thus the channel width of the FinFET, can be well controlled in view of the requirements of circuit design.

Moreover, the inventive FinFET comprises the interlayer insulating layer for separating the gate conductor from the etching stop layer and the semiconductor fin, which prevents leakage via the etching stop layer.

In a preferable embodiment, at least a portion of the gate dielectric layer extends laterally over the semiconductor substrate and overlaps the interface between the interlayer insulating layer and the etching stop layer. The etching stop layer extends laterally beyond a lateral extension of the semiconductor fin, so that the etching stop layer provide sufficient mechanical support for the semiconductor fin in the manufacture process, which improves reliability and increase product yield.

DETAILED DESCRIPTION

Figure 1:
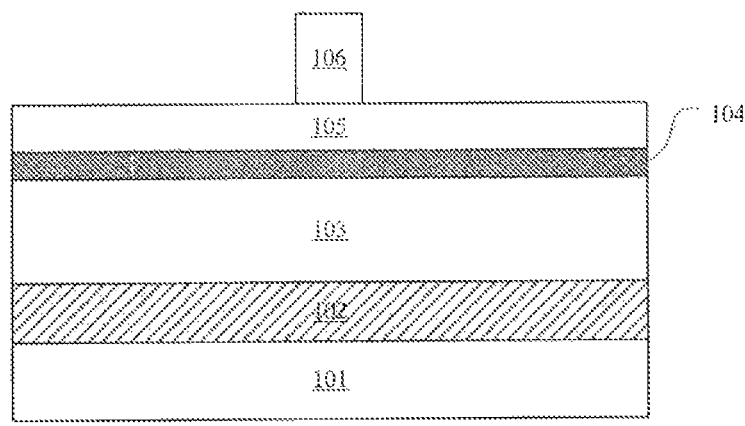
FIGS. 1 to 9 are cross-sectional views of semiconductor structures at various stages of a method of manufacturing a FinFET according to a first embodiment of the present disclosure.

Exemplary embodiments of the present disclosure will be described in more details below with reference to the accompanying drawings. In the drawings, like reference numerals denote like members. The figures are not drawn to scale, for the sake of clarity.

For simplicity, the structure of the semiconductor device having been subject to several relevant process steps may be shown in one figure.

It should be understood that when one layer or region is referred to as being "above" or "on" another layer or region in the description of device structure, it can be directly above or on the other layer or region, or other layers or regions may be intervened therebetween. Moreover, if the device in the figures is turned over, the layer or region will be "under" or "below" the other layer or region.

In contrast, when one layer is referred to as being "directly on" or "on and adjacent to" or "adjoin" another layer or region, there are not intervening layers or regions present.

In the present application, the term "semiconductor structure" means generally the whole semiconductor structure formed at each step of the method for manufacturing the semiconductor device, including all of the layers and regions having been formed.

Some particular details of the present disclosure will be described below, such as exemplary semiconductor structures, materials, dimensions, process steps and technologies of the semiconductor device, for better understanding of the present disclosure. However, it can be understood by one skilled person in the art that these details are not always essential for but can be varied in a specific implementation of the disclosure.

Unless the context clearly indicates otherwise, each part of a semiconductor device can be made of material(s) well-known to one skilled person in the art. The semiconductor material includes for example group-III-V semiconductor, such as GaAs, InP, GaN, and SiC, and group IV semiconductor, such as Si, and Ge. A gate conductor may be made of any conductive material, such as metal, doped polysilicon, and a stack of metal and doped polysilicon, among others. For example, the gate conductor may be made of one selected from a group consisting of TaC, TiN, TaTbN, TaErN, TaYbN, TaSiN, HfSiN, MoSiN, RuTax, NiTax, MoNx, TiSiN, TiCN, TaAlC, TiAlN, TaN, PtSix, $Ni_3Si$, Pt, Ru, Ir, Mo, HfRu, RuOx, and their combinations. A gate dielectric layer is made of $SiO_2$ or other dielectric insulation material which has a dielectric constant larger than that of $SiO_2$, such as an oxide, a nitride, an oxynitride, a silicate, an aluminate, and a titanate. The oxide includes for example $SiO_2$, $HfO_2$, $ZrO_2$, $Al_2O_3$, $TiO_2$, $La_2O_3$. The nitride includes for example $Si_3N_4$. The silicate includes for example HfSiOx. The aluminate includes for example $LaAlO_3$. The titanate includes for example $SrTiO_3$. The oxynitride includes for example SiON. Moreover, the gate dielectric layer may be made of those developed in the future, besides the above known materials.

According to a first embodiment of the present disclosure, various stages as shown in FIGS. 1 to 9 are performed in a gate-first process. Cross-sectional views of the semiconductor structure at various stages are given in these figures.

As shows in FIG. 1, the method according to the present disclosure starts with a semiconductor substrate 101. A SiGe layer 102 is epitaxially grown on the semiconductor substrate 101. The SiGe layer 102 has a thickness of about 10-50 nm and a Ge content of about 5-10%, A Si layer 103 is epitaxially grown on the SiGe layer 102 and has a thickness of about 20-150 nm. The Si layer 103 will be used to form a fin of the FinFET. The thickness of the Si layer 103 is controlled to further control a height of the fin in view of the requirements of circuit design.

An oxide layer 104 and a nitride layer 105 are then formed in sequence on the Si layer 103 by a conventional deposition process, such as chemical vapor deposition, atomic layer deposition, sputtering, and the like, and then a photoresist layer 106 is formed on the nitride layer 105 by spin coating, and then the photoresist layer 106 is patterned into a stripe pattern by a lithography process including exposure and development. The oxide layer 104 has a thickness of about 2-5 nm and the nitride layer 105 has a thickness of about 10-50 nm.

Figure 2:
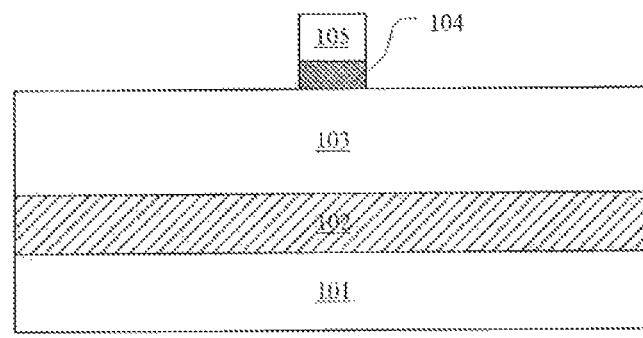

With the photoresist layer 106 as a mask, exposed portions of the nitride layer 106 and the oxide layer 104 are removed from top to bottom by a dry etching process, such as ion beam milling, plasma etching, reactive ion etching, and laser ablation, or by a wet etching process in which a solution of etchant is used. The nitride layer 105 and the oxide layer 104 together will serve as a hard mask for forming the semiconductor fin. The etching stops at the top of the Si layer 103. Then, the photoresist layer 106 is removed by ashing or dissolution with a solvent, as shown in FIG. 2.

In this step, the exposed portions of the nitride layer 105 and the oxide layer 104 are preferably removed by reactive ion etching selective with respect to the Si layer 103.

Figure 3:
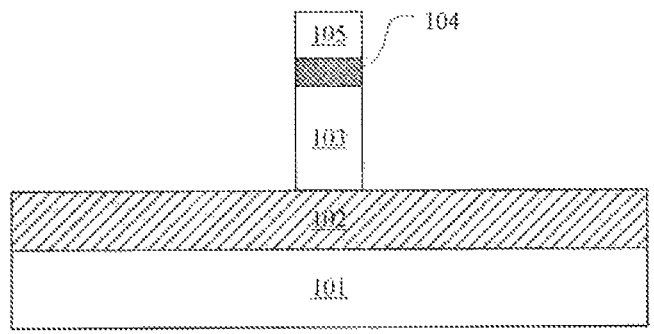

The nitride layer 105 and the oxide layer 104 together serve as a hard mask. An exposed portion of the Si layer 103 is removed by the above conventional dry etching process or the above conventional wet etching process to form a semiconductor fin from the Si layer 103, as shown in FIG. 3. The etching stops at the top of the SiGe layer 102. In FIG. 3, a width of the fin is shown in a lateral direction, and a height of the fin is shown in a vertical direction. A length of the fin in a direction perpendicular to the paper is not shown.

In this step, an exposed portion of the nitride layer 103 is preferably removed by reactive ion etching selective with respect to the SiGe layer 102.

Figure 4:
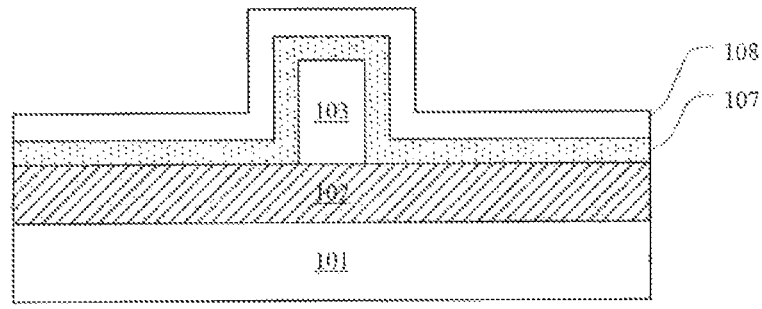

Without using a mask, the nitride layer 105 and the oxide layer 104 are then removed by the above conventional dry etching process or the above conventional wet etching process. A conformal gate dielectric layer 107 and a work function tuning metal layer 108 are formed in sequence on the surface of the semiconductor structure by the above conventional deposition process, as shown in FIG. 4. For example, the gate dielectric layer 107 is a $HfO_2$ layer having a thickness of about 2-5 nm. For example, the work function tuning metal layer 108 is a TiN layer having a thickness of about 3-15 nm. As well known by one skilled person, the work function tuning metal layer 108 is optional. The gate stack including the work function tuning metal layer 108, such as a $HfO_2$/TiN gate stack, has the beneficial effect of reducing a leakage current of the gate.

The work function tuning metal layer 108 may also be made of other conductive materials, such as TiN, TiAlN, TaN, TaAlN, TaC, and the like. No limitation is required for this.

Figure 5:
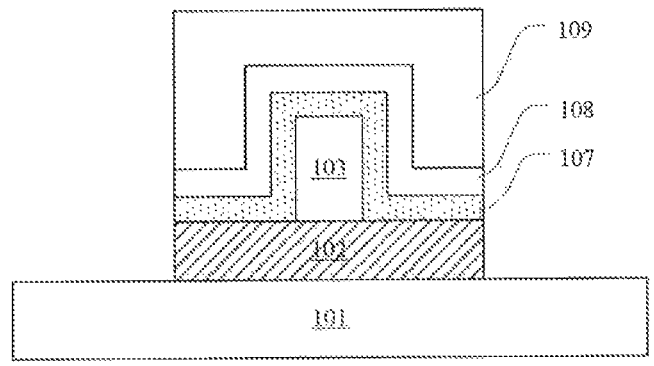

A photoresist layer 109 is then formed on the surface of the work function tuning metal layer 108 by spin coating, and patterned into a stripe pattern by a lithography process including exposure and development. The photoresist layer 109 covers at least an underlying region where the semiconductor fin has been formed. With the photoresist layer 109 as a mask, exposed portions of the work function tuning metal layer 108, the gate dielectric layer 107 and the SiGe layer 102 are removed from top to bottom by the above conventional dry etching process or the above wet etching, to define an active region of the FinFET. The etching stops at the top of the semiconductor substrate 101, as shown in FIG. 5.

in this step, the exposed portions of the work function tuning metal layer 108, the gate dielectric layer 107 and the SiGe layer 102 are removed preferably by reactive ion etching selective with respect to the semiconductor substrate 101.

The gate dielectric layer 107 comprises a first portion on the top of the Si layer 103, a second portion on the side surfaces of the Si layer 103, and a third portion extending laterally over the SiGe layer 102.

Figure 6:
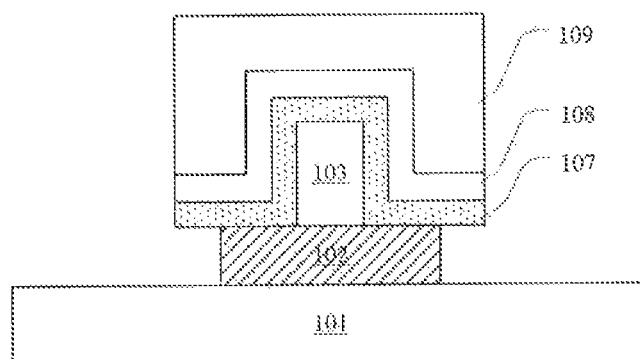

The SiGe layer 102 is further etched by an isotropic etching process which may be either a dry etching process or a wet etching process. Due to selective etching, only the SiGe layer 102 is etched laterally from its side surface to provide an undercut portion, as shown in FIG. 6. The undercut portion extends below the third portion of the gate dielectric layer 107, so that the remaining portion of the SiGe layer extends laterally beyond a lateral extension of the Si layer 103 to provide sufficient mechanical support for the Si layer 103 in subsequent steps of the manufacture process. Moreover, the lateral extension of the SiGe layer 102 provides sufficient tolerance in the lateral etching so that the SiGe layer 102 is not completely removed to punch through. As will be discussed below, the undercut portion will be filled with an insulating material to electrically isolate the SiGe layer 102 from a gate conductor to be formed.

Figure 7:
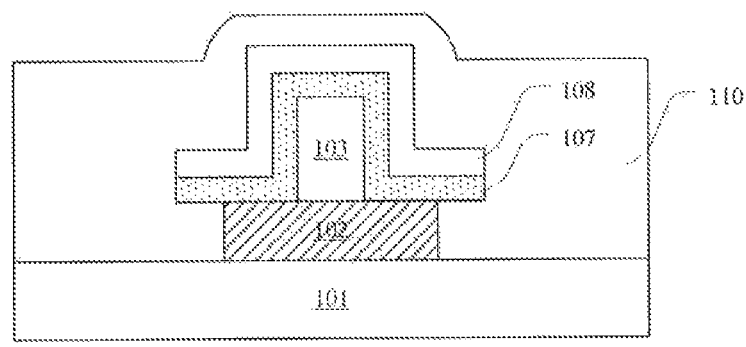
Figure 8:
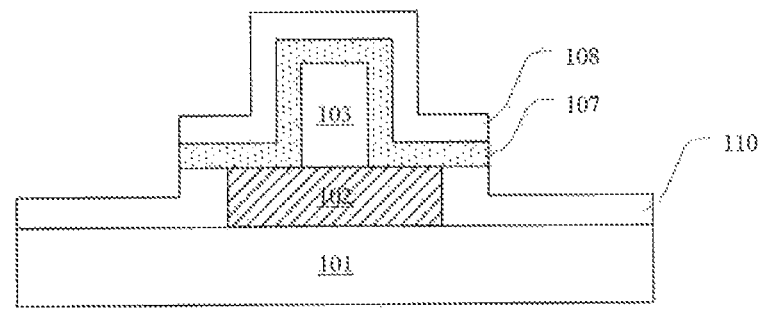

Next, the photoresist layer 109 is removed by ashing or dissolution with a solvent. An HDP oxide layer 110 is formed on the surface of the semiconductor substrate by the above conventional deposition process, as shown in FIG. 7. The HDP oxide layer 110 has a thickness of about 600 to 1000 nm, and fills the undercut portion near the SiGe layer 102. The HDP oxide layer 110 adjoins the SiGe layer 102 below the third portion of the gate dielectric layer 107. In other words, the third portion of the gate dielectric layer 107 extends over the semiconductor substrate 101 and overlaps an interface between the HDP oxide layer 110 and the SiGe layer 102.

Without using a photoresist mask, a portion of the HDP oxide layer 110 is then removed by the above conventional dry etching process and the above conventional wet etching process. Due to selective etching, only the HDP oxide layer 110 is etched. After the work function tuning metal layer 108 is exposed, it serves as a hard mask. An exposed portion of HDP oxide layer 110 continues to be removed in the etching. By controlling an etching time, the HDP oxide layer 110 is avoided to be overetched. At least the portion of the HDP oxide layer 110 over the semiconductor substrate and that fill the undercut portion near the SiGe layer 102 should be kept to electrically isolate the semiconductor substrate 101 and the SiGe layer 102 from a gate conductor to be formed.

A blanket layer of gate conductor 111 is then formed on the surface of the semiconductor structure by the above conventional deposition processes. The layer of gate conductor 111 is planarized by Chemical Mechanical Polishing (CMP), as shown in FIG. 9.

Figure 9:
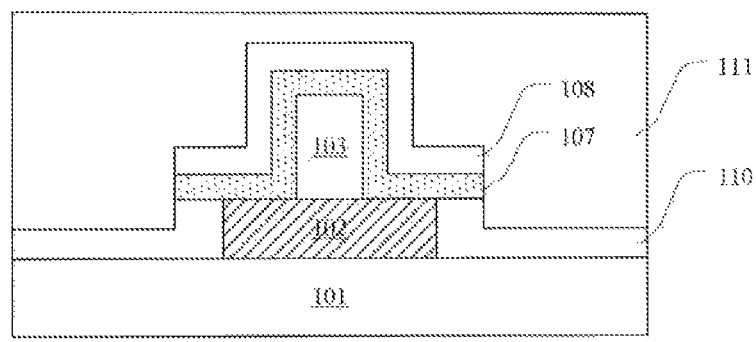

Although it is not shown in FIG. 9, the first embodiment according to the present disclosure further comprises patterning the layer of gate conductor 111 using a photoresist mask or a hard mask to form a stripe pattern extending in a direction perpendicular to a length direction of the semiconductor fin. In other words, the gate conductor 111 extends laterally in the paper. Exposed portions of the gate dielectric layer 107 and the work function tuning metal layer 108 are then removed. A source/drain implantation is then performed on two ends of the fin by a conventional process, followed by a spike anneal at about 1000-1080° C. to activate the implanted ions in the previous implantation process and remedy damages caused by the implantation process, to provide a source region and a drain region (which will be shown in FIG. 10).

Figure 10:
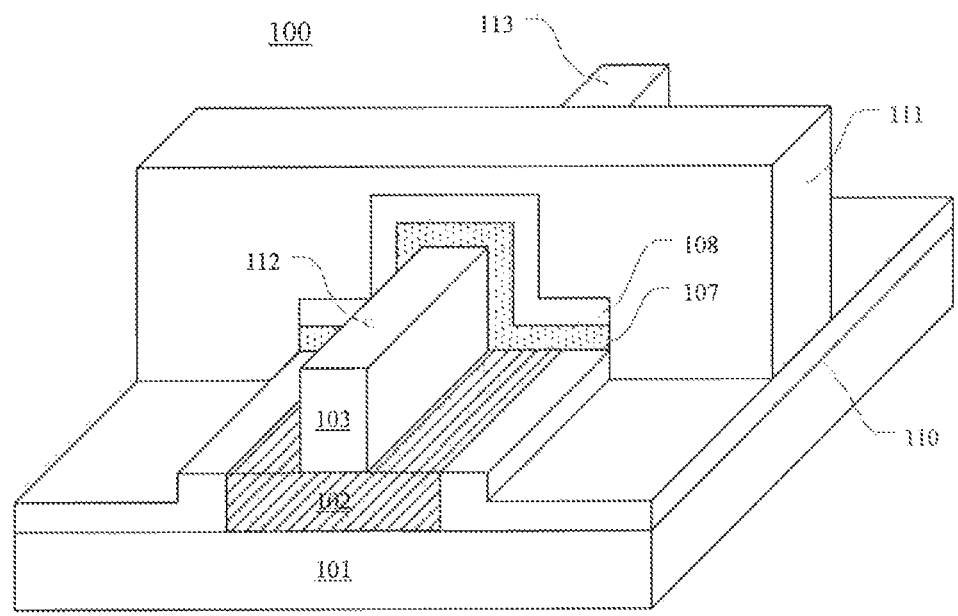
FIG. 10 is a perspective view of a FinFET manufactured by the above method according to the first embodiment of the present disclosure.

FIG. 10 is a perspective view of a FinFET manufactured by the above method according to the first embodiment of the present disclosure; The FinFET 100 comprises a SiGe layer 102 on a semiconductor substrate 101 and a Si layer 103 on the SiGe layer 102. The Si layer 103 is formed as a fin of the FinFET. The FinFET 100 further comprises a gate conductor 111 extending in a direction perpendicular to a length direction of the semiconductor fin. The gate conductor 111 covers at least two side surfaces of the semiconductor fin. A gate dielectric layer 107 and a work function tuning metal layer 108 are sandwiched by the gate conductor 111 and the semiconductor fin. An HDP oxide layer 110 electrically isolates the gate conductor 111 from the semiconductor fin and the SiGe layer 102. A source regions 112 and a drain region 113 are formed at two ends of the semiconductor fin.

According to a second embodiment of the present disclosure, various stages as shown in FIGS. 1 to 3 and 11 to 17 are performed in a gate-last process. Cross-sectional views of the semiconductor structure at various stages are given in these figures. In the description of the second embodiment, the members which have been described in the first embodiment are denoted by like reference numerals here, and the steps which have been described in the first embodiment are briefly described here.

According to the present method, a stack of a semiconductor substrate 101, a SiGe layer 102 and a Si layer 103 are provided after the steps shown in FIGS. 1 to 3. The SiGe layer 102 and the Si layer 103 are epitaxially grown. The Si layer 103 has been formed as a semiconductor fin. An oxide layer 104 and a nitride layer 105 are kept at the top of the Si layer 103.

Figure 11:
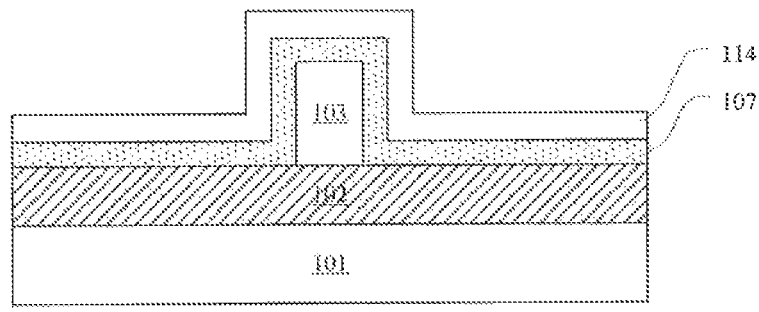
FIGS. 11 to 17 are cross-sectional views of semiconductor structures at some stages of a method of manufacturing a FinFET according to a second embodiment of the present disclosure.

Without using a mask, the nitride layer 105 and the oxide layer 104 are then removed from top to bottom by the above conventional dry etching process and the above conventional wet etching process. A conformal gate dielectric layer 107 and a polysilicon layer 114 are formed in sequence on the surface of the semiconductor structure by the above conventional deposition process, as shown in FIG. 11.

Figure 12:
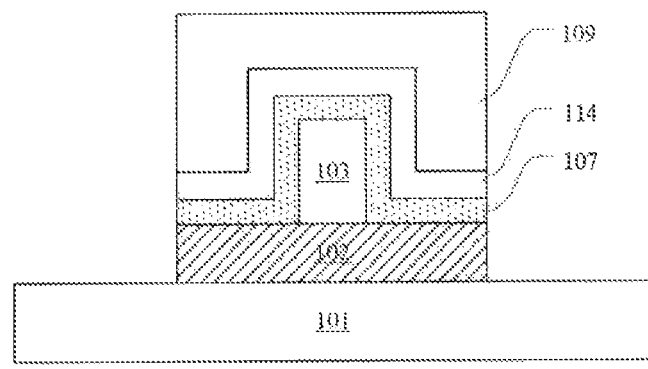

A photoresist layer 109 is then formed on the surface of the polysilicon layer 114 by spin coating, and patterned into a stripe pattern by a lithography process including exposure and development. The photoresist layer 109 covers at least an underlying region where the semiconductor fin has been formed. With the photoresist layer 109 as a mask, exposed portions of the polysilicon layer 109, the gate dielectric layer 107 and the SiGe layer 102 are removed from top to bottom by the above conventional dry etching process or the above wet etching. The etching stops at the top of the semiconductor substrate 101, as shown in FIG. 12.

In this step, the exposed portions of the polysilicon layer 114, the gate dielectric layer 107 and the SiGe layer 102 are preferably removed by reactive ion etching selective with respect to the semiconductor substrate 101.

The gate dielectric layer 107 comprises a first portion on the top of the Si layer 103, a second portion on the side surfaces of the Si layer 103, and a third portion extending laterally over the SiGe layer 102.

Figure 13:
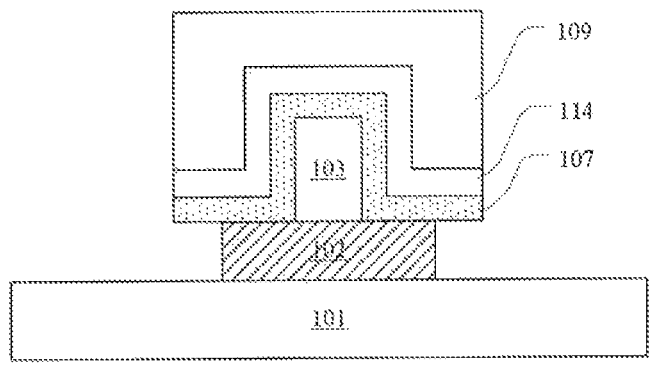

Next, the SiGe layer 102 is further etched by an isotropic etching process which may be either a dry etching process or a wet etching process. Due to selective etching, only the SiGe layer 102 is etched laterally from its side surface to provide an undercut portion, as shown in FIG. 13. The undercut portion extends below the third portion of the gate dielectric layer 107, so that the remaining portion of the SiGe layer extends laterally beyond a lateral extension of the Si layer 103 to provide sufficient mechanical support for the Si layer 103 in subsequent steps of the manufacture process. Moreover, the lateral extension of the remaining portion of the SiGe layer 102 provides sufficient tolerance in the lateral etching so that the SiGe layer 102 is not completely removed to punch through. It also ensures that the SiGe layer corresponds to the overlying semiconductor fin to compensate possible overetching in two etching steps. As will be discussed below, the undercut portion will be filled with an insulating material to electrically isolate the SiGe layer 102 from a gate conductor to be formed.

Figure 14:
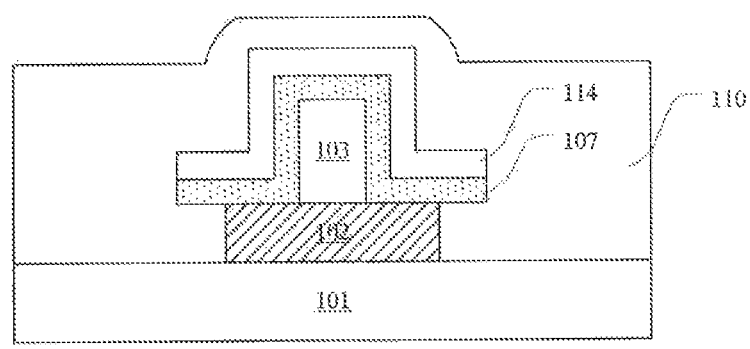
Figure 15:
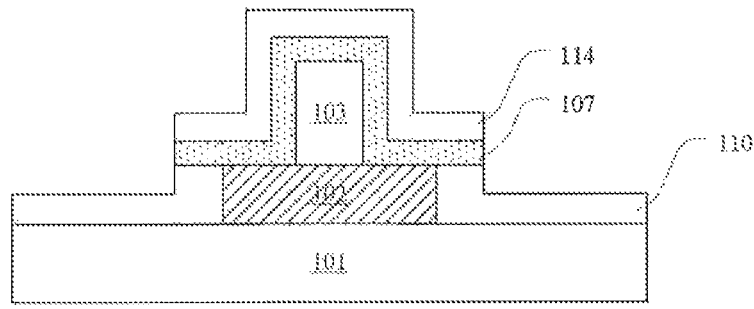

Next, the photoresist layer 109 is removed by ashing or dissolution with a solvent. An HDP oxide layer 110 is formed on the surface of the semiconductor substrate by the above conventional deposition process, as shown in FIG. 14. The HDP oxide layer 110 has a thickness of about 600 to 1000 nm, and fills the undercut portion near the SiGe layer 102. The HDP oxide layer 110 adjoins the SiGe layer 102 below the third portion of the gate dielectric layer 107. In other words, the third portion of the gate dielectric layer 107 extends over the semiconductor substrate 101 and overlaps an interface between the HDP oxide layer 110 and the SiGe layer 102.

Without using a photoresist mask, a portion of the HDP oxide layer 110 is then removed by the above conventional dry etching process and the above conventional wet etching process. Due to selective etching, only the HDP oxide layer 110 is etched. After the polysilicon layer 114 is exposed, it serves as a hard mask. An exposed portion of HDP oxide layer 110 is then removed in the etching step. By controlling an etching time, the HDP oxide layer 110 is avoided to be overetched. At least the portion of the HDP oxide layer 110 over the semiconductor substrate and that fill the undercut portion near the SiGe layer 102 should be kept to electrically isolate the semiconductor substrate 101 and the SiGe layer 102 from a gate conductor to be formed.

Figure 16:
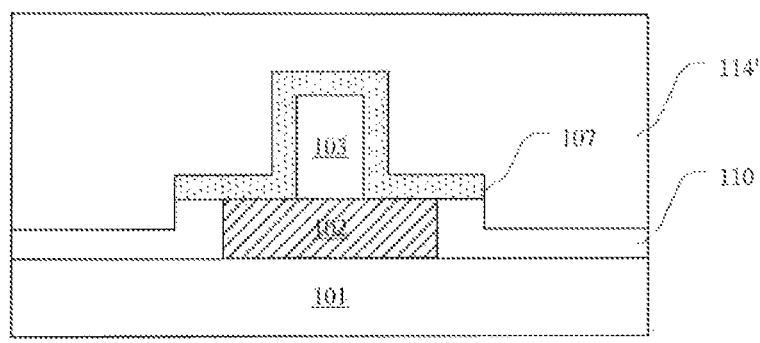

A polysilicon layer is then formed on the surface of the semiconductor structure by the above conventional deposition process. The polysilicon layer as deposited and the polysilicon layer previously deposited together form a dummy gate 114'. The dummy gate 114' is planarized by CMP, as shown in FIG. 16.

Figure 17:
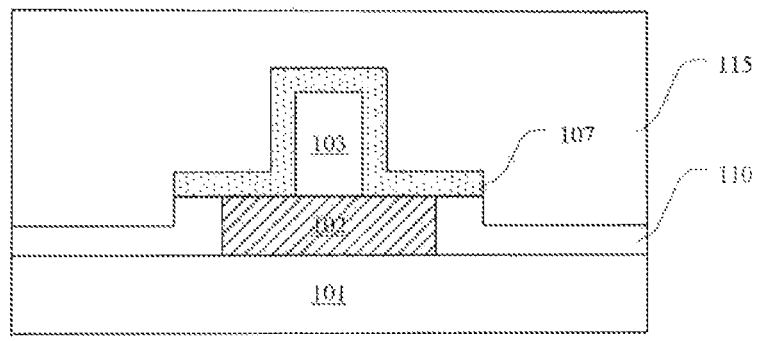

The dummy gate 114' is then replaced by a metal gate 115 in a conventional replacement gate process, as shown in FIG. 17. Preferably, the gate dielectric layer 107 is also replaced by a high-K dielectric. In a preferable embodiment, the replacement gate process comprises removing the polysilicon gate 114' and the gate dielectric layer 107 by etching using a photoresist mask to form a gate opening; forming a conformally high-K dielectric layer in the gate opening by the above conventional deposition process; forming a blanket metal layer by the above conventional deposition process; planarizing the metal layer by CMP to form the metal gate 115 and provide a planar surface.

Although it is not shown in FIG. 17, the second embodiment according to the present disclosure further comprises patterning the metal gate 115 using a photoresist mask or a hard mask to form a stripe pattern extending in a direction perpendicular to a length direction of the semiconductor fin. In other words, the metal gate 115 extends laterally in the paper. An exposed portion of the gate dielectric layer 107 is then removed. A source/drain implantation is then performed on two ends of the fin by a conventional process, followed by a spike anneal at about 1000-1080° C. to activate the implanted ions in the previous implantation process and remedy damages caused by the implantation process, to provide source/drain regions (which will be shown in FIG. 18).

Figure 18:
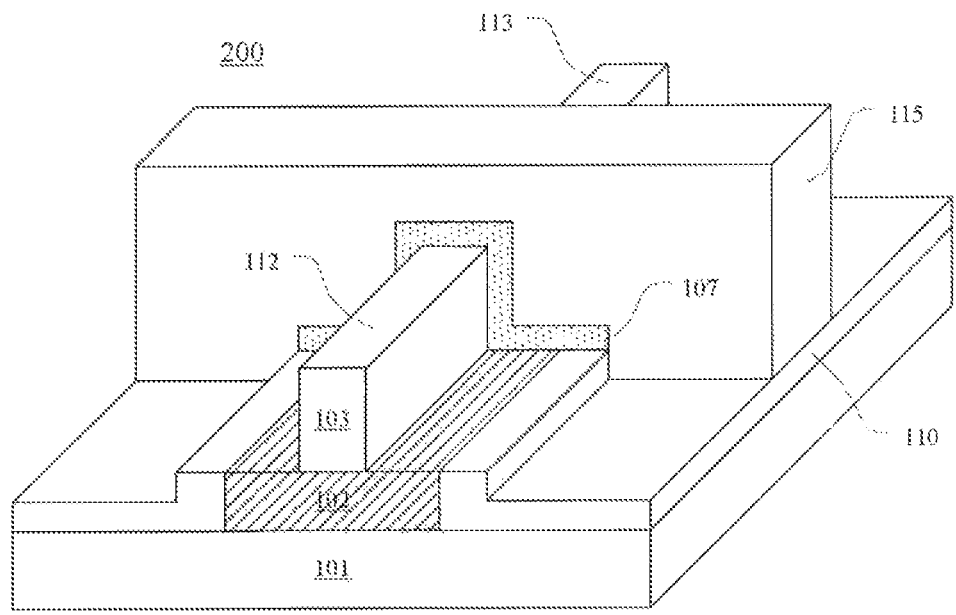
FIG. 18 is a perspective view of a FinFET manufactured by the above method according to the second embodiment of the present disclosure.

FIG. 18 is a perspective view of a FinFET manufactured by the above method according to the second embodiment of the present disclosure; The FinFET 200 comprises a SiGe layer 102 on a semiconductor substrate 101 and a Si layer 103 on the SiGe layer 102. The Si layer 103 is formed as a fin of the FinFET. The FinFET 100 further comprises a metal gate 115 extending in a direction perpendicular to a length direction of the semiconductor fin. The metal gate 115 covers at least two side surfaces of the semiconductor fin. A gate dielectric layer 107 is sandwiched by the metal gate 115 and the semiconductor fin. An HDP oxide layer 115 electrically isolates the metal gate 115 from the semiconductor fin and the SiGe layer 102. A source regions 112 and a drain region 113 are formed at two ends of the semiconductor fin.

While the disclosure has been described with reference to specific embodiments, the description is illustrative of the disclosure. For example, the semiconductor fin may be made of any suitable semiconductor material, and the etching stop layer may be made of any material which is stable in the etching step for forming the semiconductor fin, though the Si layer 103 is an example of the semiconductor fin of the FinFET and the SiGe layer 102 is an example of the etching stop layer in the etching step for forming the semiconductor fin in the above embodiments. For example, the HDP oxide layer 110 is used as an interlayer spacer layer and may be replaced by any suitable insulating material, though the HDP oxide layer 110 is an example of the interlayer spacer layer for separating the gate conductor 111 from the semiconductor fin and the SiGe layer 102 in the above embodiments.

The description is not to be considered as limiting the disclosure. The description is not to be considered as limiting the disclosure.

We claim:

1. A method for manufacturing a FinFET, comprising:
   forming an etching stop layer on a semiconductor substrate;
   forming a semiconductor fin on the etching stop layer;
   forming a gate dielectric layer on the semiconductor fin and on the etching stop layer;
   removing a portion of the gate dielectric layer and a portion of the etching stop layer to expose the corresponding portion of the surface of the semiconductor substrate;
   forming an interlayer insulating layer on the exposed surface of the semiconductor substrate and below a portion of the gate dielectric layer so that the interlayer insulating layer adjoins the etching stop layer below the gate dielectric layer;
   forming a gate conductor on the gate dielectric layer and on the interlayer insulating layer, wherein the gate conductor covers at least two side surfaces of the semiconductor fin; and
   forming a source region and a drain region by implanting ions at two ends of the semiconductor fin.

2. The method according to claim 1, wherein after removing the portion of the gate dielectric layer and the portion of the etching stop layer, at least a portion of the gate dielectric layer extends laterally over the semiconductor substrate.

3. The method according to claim 2, wherein after forming the interlayer insulating layer, the portion of the gate dielectric layer extending laterally over the semiconductor substrate overlaps an interface between the interlayer insulating layer and the etching stop layer.

4. The method according to claim 1, wherein the gate conductor covers a top surface and both side surfaces of the semiconductor fin.

5. The method according to claim 1, wherein forming the semiconductor fin comprises:
   forming a semiconductor layer on the etching stop layer;
   forming a hard mask on the semiconductor layer; and
   removing the exposed portion of the semiconductor layer by etching so that the remaining portion of the semiconductor layer forms the semiconductor fin.

6. The method according to claim 5, wherein the etching stop layer and the semiconductor fin have etching selectivity with respect to each other.

7. The method according to claim 5, wherein forming the hard mask comprises:
- forming an oxide layer on the semiconductor layer;
- forming a nitride layer on the oxide layer;
- forming a photoresist mask on the nitride layer; and
- removing exposed portions of the nitride layer and the oxide layer so that the remaining portions of the nitride layer and the oxide layer together serve as the hard mask.

8. The method according to claim 1, wherein forming the interlayer insulating layer comprises:
- defining an active region of the FinFET to expose the surface of the semiconductor substrate and side surfaces of the etching stop layer;
- removing a portion of the etching stop layer by etching laterally below the gate dielectric layer to form an undercut portion; and
- forming the interlayer insulating layer, which fills the undercut portion near the etching stop layer.

9. The method according to claim 1, further comprising, between forming the gate dielectric layer and forming the interlayer insulating layer,
- forming a work function tuning metal layer between the gate conductor and the gate dielectric layer.

10. The method according to claim 1, wherein a dummy gate is formed when forming the gate conductor, and the method further comprises, after forming the source region and the drain region,
- replacing the dummy gate with a metal gate.

* * * * *

UNITED STATES PATENT AND TRADEMARK OFFICE
CERTIFICATE OF CORRECTION

Page 1 of 1

PATENT NO. : 8,673,704 B2
APPLICATION NO. : 13/579192
DATED : March 18, 2014
INVENTOR(S) : Huilong Zhu et al.

It is certified that error appears in the above-identified patent and that said Letters Patent is hereby corrected as shown below:

In the Specification

Col. 4, Line 12
  Delete "106"
  Insert --105--

Signed and Sealed this
Twelfth Day of August, 2014

Michelle K. Lee
*Deputy Director of the United States Patent and Trademark Office*